United States Patent
Berry et al.

(10) Patent No.: US 8,680,763 B2
(45) Date of Patent: Mar. 25, 2014

(54) ORGANIC ELECTROLUMINESCENT DEVICE AND METHOD OF FABRICATION

(75) Inventors: Martial Berry, Bordeaux (FR); Oscar Fernandez, Great Cambourne (GB); Richard Wilson, Girton (GB)

(73) Assignees: Cambridge Display Technology Limited, Cambridgeshire (GB); Sumitomo Chemical Company Limited, Tokyo (JP)

(*) Notice: Subject to any disclaimer, the term of this patent is extended or adjusted under 35 U.S.C. 154(b) by 0 days.

(21) Appl. No.: 13/258,583

(22) PCT Filed: Apr. 15, 2010

(86) PCT No.: PCT/GB2010/000797
§ 371 (c)(1),
(2), (4) Date: Nov. 23, 2011

(87) PCT Pub. No.: WO2010/119273
PCT Pub. Date: Oct. 21, 2010

(65) Prior Publication Data
US 2012/0062109 A1  Mar. 15, 2012

(30) Foreign Application Priority Data
Apr. 16, 2009  (GB) .................................. 0906554.1

(51) Int. Cl.
*H01L 51/52* (2006.01)
(52) U.S. Cl.
USPC .......................................... 313/506; 428/690
(58) Field of Classification Search
USPC .............. 257/40, 72, 98–100, 642–643, 759; 313/498–512; 315/169.1, 169.3; 427/58, 64, 66, 532–535, 539; 428/690–691, 917; 438/26–29, 34, 82, 438/455; 445/24–25
See application file for complete search history.

(56) References Cited

U.S. PATENT DOCUMENTS

| 4,539,507 A | 9/1985 | VanSlyke et al. |
| 5,006,366 A * | 4/1991 | Lindmayer ..................... 427/71 |

(Continued)

FOREIGN PATENT DOCUMENTS

| EP | 0 707 020 A2 | 4/1996 |
| EP | 0 842 208 A1 | 5/1998 |

(Continued)

OTHER PUBLICATIONS

Bernius et al., "Progress with Light-Emitting Polymers," *Adv. Mat.*, 12(23):1737-1750 (2000).

(Continued)

*Primary Examiner* — Donald Raleigh
(74) *Attorney, Agent, or Firm* — Marshall, Gerstein & Borun LLP (57) ABSTRACT

An organic electroluminescent device comprises an anode; a cathode; a first electroluminescent layer between the anode and the cathode comprising an electron transporting material; and a second electroluminescent layer between the first electroluminescent layer and the anode. The second electroluminescent layer comprises a hole transporting material and an electroluminescent electron trapping material. The first electroluminescent layer may comprises a polymer having an electron transporting material and an electroluminescent material, and may include an optionally electroluminescent hole-transporting material. The electron transporting material and one or both of the hole transporting material of the first electroluminescent layer and the electroluminescent material of the first electroluminescent layer are part of the same molecule or polymer. Preferably, the electron transporting material comprises a plurality of adjacent arylene repeat units.

17 Claims, 4 Drawing Sheets

(56) References Cited

U.S. PATENT DOCUMENTS

| | | | |
|---|---|---|---|
| 5,150,006 A | | 9/1992 | Van Slyke et al. |
| 5,424,560 A | * | 6/1995 | Norman et al. ............... 257/40 |
| 5,432,014 A | | 7/1995 | Sano et al. |
| 5,621,131 A | | 4/1997 | Kreuder et al. |
| 5,723,873 A | | 3/1998 | Yang |
| 5,798,170 A | | 8/1998 | Zhang et al. |
| 5,807,627 A | | 9/1998 | Friend et al. |
| 6,083,634 A | | 7/2000 | Shi |
| 6,268,695 B1 | | 7/2001 | Affinito |
| 6,353,083 B1 | | 3/2002 | Inbasekaran et al. |
| 6,538,263 B1 | * | 3/2003 | Park et al. ............... 257/40 |
| 7,094,477 B2 | | 8/2006 | Kamatani et al. |
| 7,147,935 B2 | | 12/2006 | Kamatani et al. |
| 7,238,435 B2 | | 7/2007 | Kamatani et al. |
| 2002/0024298 A1 | | 2/2002 | Fukunaga |
| 2002/0117662 A1 | | 8/2002 | Nii |
| 2002/0182441 A1 | | 12/2002 | Lamansky et al. |
| 2006/0051563 A1 | * | 3/2006 | Okumoto et al. ............. 428/212 |
| 2006/0289882 A1 | | 12/2006 | Nishimura et al. |
| 2007/0126347 A1 | * | 6/2007 | Jarikov et al. ............... 313/506 |
| 2008/0246393 A1 | * | 10/2008 | Qiu et al. ............... 313/504 |
| 2008/0268285 A1 | * | 10/2008 | Okinaka et al. ............. 428/691 |
| 2009/0026938 A1 | | 1/2009 | Okada et al. |
| 2009/0066220 A1 | * | 3/2009 | Handa et al. ............... 313/503 |
| 2009/0140642 A1 | * | 6/2009 | Kadoma et al. ............... 313/504 |
| 2009/0167168 A1 | * | 7/2009 | Seo et al. ............... 313/504 |
| 2009/0200923 A1 | * | 8/2009 | Fujita et al. ............... 313/504 |
| 2009/0243469 A1 | * | 10/2009 | Horiba et al. ............... 313/504 |

FOREIGN PATENT DOCUMENTS

| | | |
|---|---|---|
| EP | 0 880 303 A1 | 11/1998 |
| EP | 0 901 176 A2 | 3/1999 |
| EP | 0 947 123 A1 | 10/1999 |
| EP | 0 949 850 A1 | 10/1999 |
| EP | 1 245 659 | 10/2002 |
| EP | 1 863 105 A2 | 12/2007 |
| GB | 2 348 316 A | 9/2000 |
| JP | 2002-117985 A | 4/2002 |
| JP | 2002-324679 A | 11/2002 |
| JP | 2004-079413 A | 3/2004 |
| JP | 2005-310741 A | 11/2005 |
| JP | 2006-013103 A | 1/2006 |
| JP | 2007-321022 A | 12/2007 |
| JP | 2008-053664 A | 3/2008 |
| JP | 2009-032990 A | 2/2009 |
| WO | WO-90/13148 A1 | 11/1990 |
| WO | WO-98/10621 A1 | 3/1998 |
| WO | WO-98/57381 A1 | 12/1998 |
| WO | WO-99/48160 A1 | 9/1999 |
| WO | WO-00/48258 A1 | 8/2000 |
| WO | WO-00/53656 A1 | 9/2000 |
| WO | WO-00/55927 A1 | 9/2000 |
| WO | WO-01/19142 A1 | 3/2001 |
| WO | WO-01/62869 A1 | 8/2001 |
| WO | WO-01/81649 A1 | 11/2001 |
| WO | WO-02/31896 A2 | 4/2002 |
| WO | WO-02/44189 A1 | 6/2002 |
| WO | WO-02/45466 A1 | 6/2002 |
| WO | WO-02/066552 A1 | 8/2002 |
| WO | WO-02/068435 A1 | 9/2002 |
| WO | WO-02/081448 A1 | 10/2002 |
| WO | WO-02/084759 A1 | 10/2002 |
| WO | WO-03/018653 A1 | 3/2003 |
| WO | WO-03/022908 A1 | 3/2003 |
| WO | WO-2006/067508 A1 | 6/2006 |
| WO | WO-2007/071957 A1 | 6/2007 |
| WO | WO-2008/010915 A2 | 1/2008 |
| WO | WO-2008/072539 A1 | 6/2008 |
| WO | WO-2008/102713 A1 | 8/2008 |
| WO | WO-2010/013006 A2 | 2/2010 |

OTHER PUBLICATIONS

Chen et al., "Recent Developments in Molecular Organic Electroluminescent Materials," *Macromol. Sym.*, 125:1-48 (1997).

Michaelson, "The work function of the elements and its periodicity", *J. Applied Physics*, 48(11): 4729-4733 (1977).

Niu et al., "Thermal Annealing Below the Glass Transition Temperature: A General Way to Increase Performance of Light-Emitting Diodes Based on Copolyfluorenes," *Appl. Phys. Lett.*, 81(4):634-636 (2002).

Setayesh et al., "Bridging the Gap Between Polyfluorene and Ladder-Poly-p-phenylene: Synthesis and Characterization of Poly-2,8-indenofluorene," *Macromolecules*, 33(6):2016-2020 (2000).

Tokito et al., "Metal oxides as a hole-injecting layer for an organic electroluminescent device", *J. Phys. D: Appl. Phys.*, 29:2750-2753 (1996).

Yamaguchi et al., "Effects of B and C on the Ordering of L10-CoPt Thin Films," *Appl. Phys. Lett.*, 79(5):2001-2003 (2001).

Yamamoto, "Electrically Conducting and Thermally Stable $\pi$-Conjugated Poly(Arylenes)s Prepared by Organometallic Processes," *Prog. Polym. Sci.*, 17:1153-1205 (1993).

Yang et al., "Efficient blue polymer light-emitting diodes from a series of soluble poly(paraphenylene)s", *J. Appl. Phys.*, 79(2):934-939 (1996).

International Preliminary Report on Patentability for Application No. PCT/GB2010/000797, dated Oct. 18, 2011.

International Search Report and Written Opinion for Application No. PCT/GB2010/000797, dated Aug. 13, 2010.

Search Report for Application No. GB0906554.1, dated Aug. 17, 2009.

English translation of Office Action for corresponding Japanese Patent Application No. 2012-505232, dated Dec. 3, 2013.

\* cited by examiner

ORGANIC ELECTROLUMINESCENT DEVICE AND METHOD OF FABRICATION

This invention related to an organic electroluminescent device and a method of making it.

BACKGROUND OF THE INVENTION

One class of opto-electrical devices is that using an organic material for light emission. The basic structure of these devices is a light emissive organic layer, for instance a film of a poly (p-phenylenevinylene) ("PPV") or polyfluorene, sandwiched between a cathode for injecting negative charge carriers (electrons) and an anode for injecting positive charge carriers (holes) into the organic layer. The electrons and holes combine in the organic layer generating photons. In WO90/13148 the organic light-emissive material is a conjugated polymer. In U.S. Pat. No. 4,539,507 the organic light-emissive material is of the class known as small molecule materials, such as (8-hydroxyquinoline) aluminium ("Alq3"). In a practical device one of the electrodes is transparent, to allow the photons to escape the device. These organic light-emissive devices ("OLEDs") have great potential for display and lighting applications.

Figure 1:
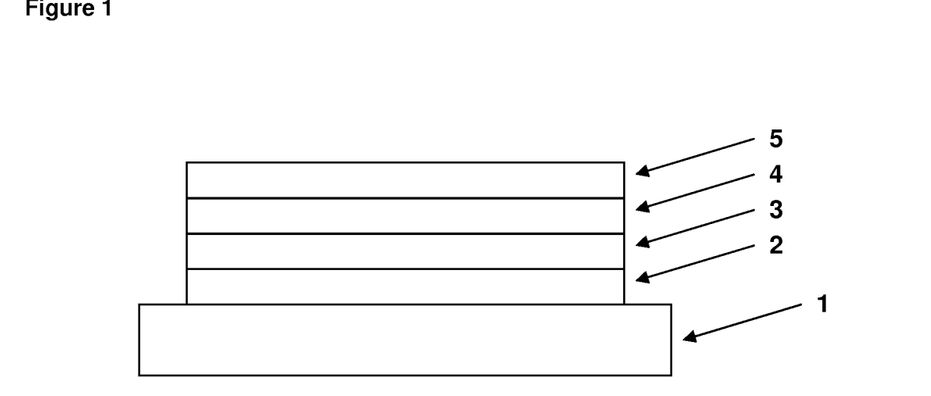
FIG. 1 shows an organic light emitting device.

With reference to FIG. 1, a typical OLED is fabricated on a glass or plastic substrate 1 coated with a transparent anode 2 such as indium-tin-oxide ("ITO") and covered with, in sequence, a hole transporting layer 3, a layer of organic electroluminescent material 4 and a cathode 5. The cathode is typically a metal or alloy and may comprise a single layer, such as aluminium, or a plurality of layers such as calcium and aluminium. Further layers may be provided between the electroluminescent layer and the electrodes in order to enhance charge transport to the electroluminescent layer. This includes electron blocking layers between the anode and the electroluminescent layer, and electron transporting and/or hole blocking layers between the cathode and the electroluminescent layer.

Figure 2:
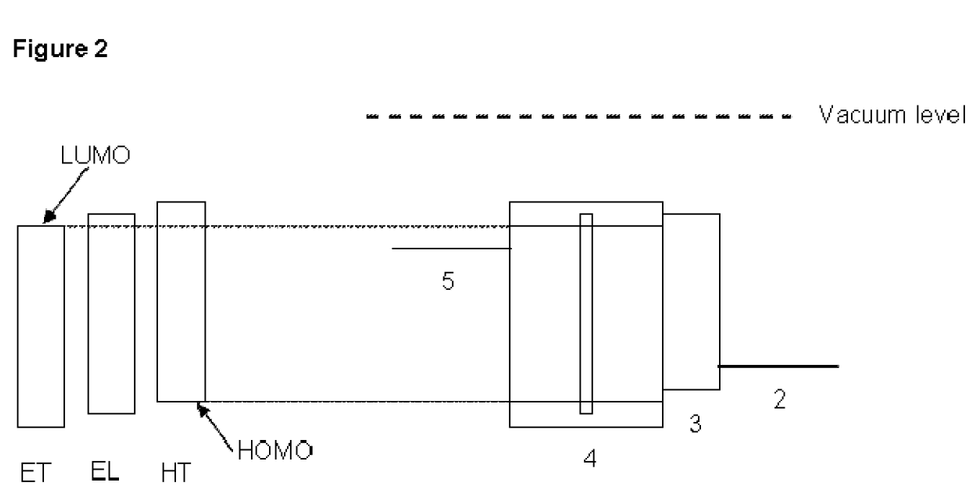
FIG. 2 shows an energy diagram of a prior art OLED.

FIG. 2 illustrates the energy levels of the device of FIG. 1. The electroluminescent layer illustrated here comprises hole transport "HT", electron transport "ET" and electroluminescent "EL" materials. These materials may be provided as a blend within the electroluminescent layer or as components of the same molecule as described in, for example, WO 99/48160.

Figure 3:
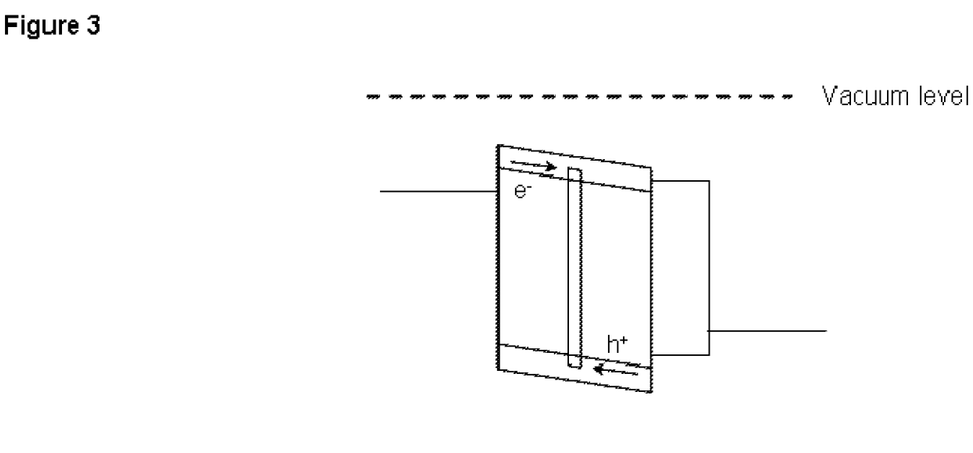
FIG. 3 shows an energy diagram of the OLED of FIG. 2 when in operation.

As shown in FIG. 3 holes are injected into the device through the anode and electrons are injected into the device through the cathode when the device is operated. The holes "float" to the highest occupied molecular orbital (HOMO) of the electroluminescent material and electrons "sink" to the lowest unoccupied molecular orbital (LUMO) of the electroluminescent material and then combine to form an exciton which undergoes radiative decay to give light.

In the above-described device, emission is from one electroluminescent species only. However, devices are known wherein electroluminescence originates from more than one electroluminescent species. In one such device disclosed in WO 99/48160, more than one electroluminescent material is provided in the electroluminescent layer. WO 2006/067508 and U.S. Pat. No. 5,807,627 disclose another arrangement wherein the device comprises more than one electroluminescent layer.

It is obviously desirable to maximize the efficiency of an OLED. This can be done by selection of electroluminescent materials that are inherently highly efficient (as measured, for example, by their photoluminescent efficiency) or optimization of device architecture in order to achieve efficient and balanced transport of holes and electrons.

However, the present inventors have found that use of certain materials in the electroluminescent layer of an OLED comprising multiple emissive species results in unexpectedly low device efficiency and higher drive voltage.

SUMMARY OF THE INVENTION

Upon extensive investigation, the present inventors have found that use of an electroluminescent material with a deep LUMO level relative to other materials in the device results in poor device performance.

The inventors have found that the problem associated with electron trapping by electroluminescent materials with a deep LUMO level can be reduced or eliminated by providing that material in a hole transporting layer of the device, thus producing a device with two emissive layers.

Accordingly, in a first aspect the invention provides an organic electroluminescent device.

In one embodiment, the organic electroluminescent device comprises an anode; a cathode; a first electroluminescent layer between the anode and the cathode comprising an electron transporting material; and a second electroluminescent layer between the first electroluminescent layer and the anode, characterized in that said second electroluminescent layer comprises a hole transporting material and an electroluminescent electron trapping material.

By "electron trapping material" as used herein is meant a material having a LUMO level of more than about 200 meV below that of the electron transporting material. To avoid any doubt, "below" as used herein means "further from vacuum level" and, likewise, "above" has the opposite meaning.

In one embodiment, the electron transporting material also provides the electroluminescence of the first electroluminescent layer.

In another embodiment, the first electroluminescent layer comprises the electron transporting material and a further, electroluminescent material.

Preferably, the first electroluminescent layer comprises a hole-transporting material. This hole transporting material may also provide the electroluminescence of the first electroluminescent layer.

The different materials within an electroluminescent layer may be linked together to form segments of a multifunctional molecule. Thus, two or more of the hole transporting material, electron transporting material and electroluminescent material may be part of the same molecule, and the term "material" should be construed accordingly. Preferably, this molecule is a polymer.

Optionally, the molecule is a polymer and the electron transporting material comprises a plurality of adjacent arylene repeat units. In particular, a plurality (at least 2, and in particular 3 or more) of adjacent fluorene repeat units form an effective electron transporting segment.

Optionally, the hole-transporting material is an amine.

Optionally, the first electroluminescent layer emits white light, that is light falling within a region having a CIE x coordinate equivalent to that emitted by a black body at 1000-13,000K and CIE y coordinate within 0.05 of the CIE y coordinate of said light emitted by a black body.

Optionally, the electron trapping electroluminescent material is phosphorescent. Optionally, the electron trapping electroluminescent material has a peak photoluminescent wavelength in the range of 570-620 nm.

Optionally, the second electroluminescent layer comprises a hole-transporting amine material, preferably an amine-containing polymer.

The LUMO of the electron trapping electroluminescent material preferable more than 200 meV below the LUMO of the electron-transporting The LUMO of the electron trapping electroluminescent material is very preferably equal to or greater than 300 meV, optionally equal to or greater than 400 meV below the LUMO of the electron-transporting material.

In one preferred embodiment, the combined emission of the two electroluminescent materials in the device provides white light.

In a second aspect, the invention provides a method of forming a device according to the first aspect of the invention comprising the steps of depositing the second electroluminescent layer over the anode; depositing the first electroluminescent layer over the second electroluminescent layer; and depositing a cathode over the second electroluminescent layer.

Preferably, at least one of the first and second electroluminescent layers are deposited from a solution in a solvent.

Preferably, the second electroluminescent layer is crosslinked prior to deposition of the second electroluminescent layer.

BRIEF DESCRIPTION OF THE FIGURES

The invention will now be described in more detail with reference to the Figures, wherein.

DETAILED DESCRIPTION OF THE INVENTION

The present inventors have studied a device comprising the layer structure of FIG. 1 wherein the electroluminescent layer 4 comprises an electron transporting material ET and two electroluminescent materials EL1 and EL2. The present inventors found that the drive voltage and efficiency of this device is very significantly reduced as compared to a device comprising EL1 only.

Figure 4:
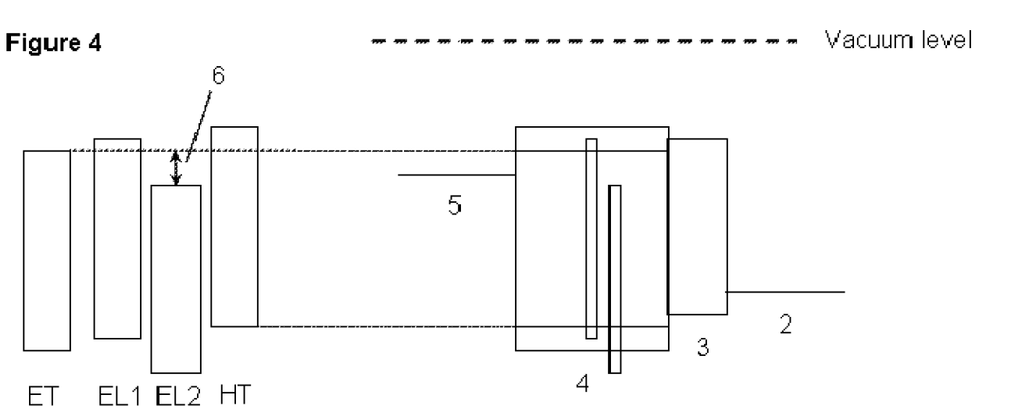
FIG. 4 shows an energy diagram of an OLED for comparison with the OLED of the present invention.
Figure 5:
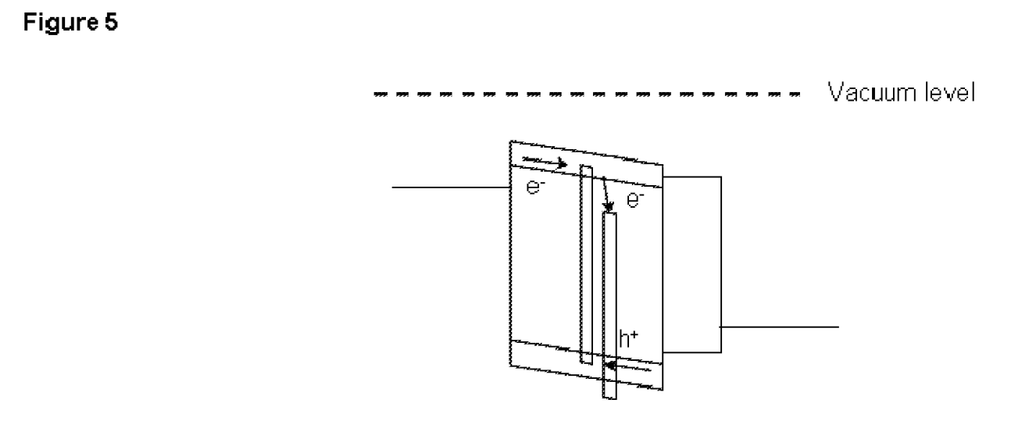
FIG. 5 shows an energy diagram of the OLED of FIG. 4 when in operation.

The energy levels of this device are shown in FIG. 4. There is a large gap 6 between the LUMO level of EL2 and that of the electron transporting material ET such that EL2 functions as an electron trap when the device when operated (FIG. 5).

Figure 6:
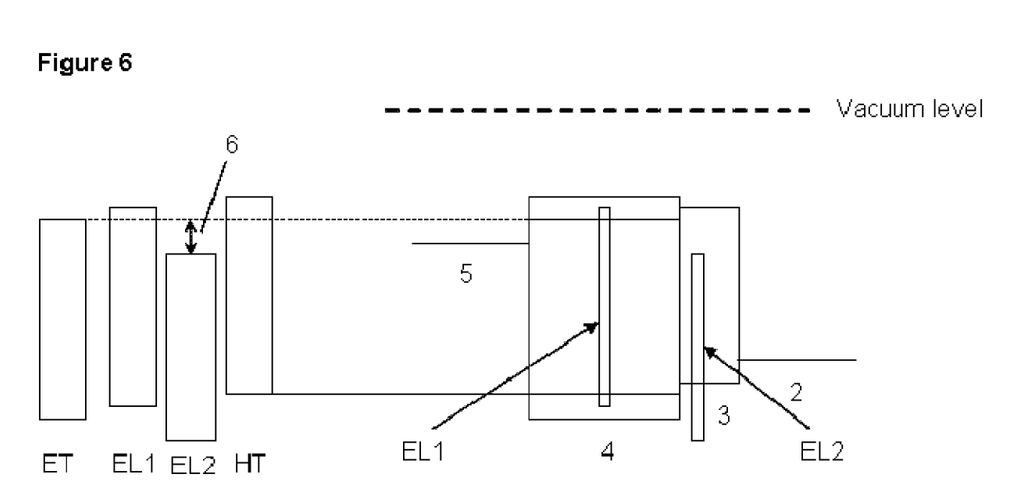
FIG. 6 shows an energy diagram of an OLED of the present invention.

The present inventors solved this problem by moving the electron-trapping electroluminescent material EL2 into the hole transporting layer 3 to create a device with two electroluminescent layers shown in FIG. 6, namely hole transporting electroluminescent layer 3 and electron transporting electroluminescent layer 4. In operation, shown in FIG. 7, a proportion of the electrons that are injected into electron-transporting layer 4 enter the LUMO of EL1 and combine with holes to form an exciton, and a proportion of the remaining electrons diffuse into the electroluminescent layer, where they may enter the LUMO of EL2 and participate in formation of excitons.

Figure 7:
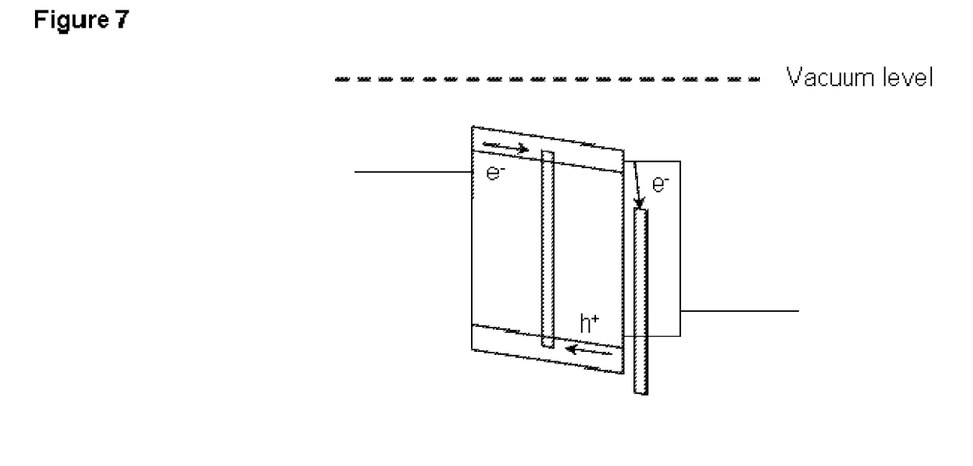
FIG. 7 shows an energy diagram of the OLED of FIG. 6 when in operation.

Typically, the majority of electrons are absorbed by layer 4, leaving only a minority of electrons to enter layer 3 and form excitons. Some emission from the second electroluminescent layer may also arise from the electron trapping electroluminescent material absorbing excitons diffusing from the first electroluminescent layer.

Electron Transporting Electroluminescent Layer

The electron transporting material preferably comprises a plurality of adjacent polyarylene units as disclosed in, for example, Adv. Mater. 2000 12(23) 1737-1750 and references therein. Exemplary arylene units include carbocyclic aromatics such as: 1,4-phenylene repeat units as disclosed in J. Appl. Phys. 1996, 79, 934; fluorene repeat units as disclosed in EP 0842208; indenofluorene repeat units as disclosed in, for example, Macromolecules 2000, 33(6), 2016-2020; and spirofluorene repeat units as disclosed in, for example EP 0707020. Each of these repeat units is optionally substituted. Examples of substituents include solubilising groups such as $C_{1-20}$ alkyl or alkoxy; electron withdrawing groups such as fluorine, nitro or cyano; and substituents for increasing glass transition temperature (Tg) of the polymer.

In addition to providing electron transport, the aforementioned polyarylene units may provide the emission from the electron transporting electroluminescent layer.

Particularly preferred polymers comprise optionally substituted, 2,7-linked fluorenes, most preferably repeat units of formula I:

(I)

wherein $R^1$ and $R^2$ are independently selected from hydrogen or optionally substituted alkyl wherein one or more non-adjacent C atoms may be replaced with O, S, N, C=O and —COO—, alkoxy, aryl, arylalkyl, heteroaryl and heteroarylalkyl. More preferably, at least one of $R^1$ and $R^2$ comprises an optionally substituted $C_4$-$C_{20}$ alkyl or aryl group.

In the case where $R^1$ or $R^2$ is aryl or heteroaryl, preferred optional substituents include alkyl groups wherein one or more non-adjacent C atoms may be replaced with O, S, N, C=O and —COO—.

Optional substituents for the phenyl rings of fluorene unit (i.e. other than substituents $R^1$ and $R^2$) are preferably selected from the group consisting of alkyl wherein one or more non-adjacent C atoms may be replaced with O, S, N, C=O and —COO—, optionally substituted aryl, optionally substituted heteroaryl, alkoxy, alkylthio, fluorine, cyano and arylalkyl.

Preferably, the polymer comprises an arylene repeat unit as described above and an arylamine repeat unit, in particular a repeat unit II for hole transport and/or emission:

(II)

wherein $Ar^1$ and $Ar^2$ are optionally substituted aryl or heteroaryl groups, n is greater than or equal to 1, preferably 1 or 2, and R is H or a substituent, preferably a substituent. R is preferably alkyl or aryl or heteroaryl, most preferably aryl or heteroaryl. Any of the aryl or heteroaryl groups in the unit of formula 1 may be substituted. Preferred substituents include alkyl and alkoxy groups. Any of the aryl or heteroaryl groups in the repeat unit of Formula 1 may be linked by a direct bond or a divalent linking atom or group. Preferred divalent linking atoms and groups include O, S; substituted N; and substituted C.

Particularly preferred units satisfying Formula 1 include units of Formulae 1-3:

wherein $Ar^1$ and $Ar^2$ are as defined above; and $Ar^3$ is optionally substituted aryl or heteroaryl. Where present, preferred substituents for $Ar^3$ include alkyl and alkoxy groups.

Preferred concentration of the arylamine unit is in the range from about 0.1 mol % up to 30 mol %, preferably up to 20 mol %. These percentages apply to the total number of arylamine units present in the polymer in the case where more than one type of repeat unit of formula V is used.

In one embodiment, an arylamine unit provides the functions of both emission and hole transport. In another embodiment, two different arylamine repeat units are provided: one for hole transport and the other for emission, in particular blue emission.

The polymer may also comprise heteroarylene repeat units for charge transport and/or emission.

The electron transporting material preferably further provides the functions of hole transport and/or emission as disclosed in, for example, WO 00/55927 and U.S. Pat. No. 6,353,083, in particular by way of different functional segments within a molecule, in particular a polymer.

The different segments within such a polymer may be provided along the polymer backbone, as per U.S. Pat. No. 6,353,083, or as groups pendant from the polymer backbone as per WO 01/62869.

In one embodiment, the electron transport layer includes a white-light emitting material. Preferably, this material is a polymer comprising red, green and blue electroluminescent segments. In one embodiment, the electron transporting material is a white emitter. Suitable white emitting materials include materials described in GB 0801227.0 which discloses white light emitting materials comprising a polymer having an emitting polymer chain and at least one emitting end capping group. In particular, the polymer may comprise a fluorescent chain (such as a blue fluorescent chain) and phosphorescent end-capping groups (such as red phosphorescent end-capping groups).

Low bandgap emitters in this layer, in particular red emitters, are preferably phosphorescent. The phosphorescent material is preferably provided as a dopant in a host material, such as the electron transporting material. The host material should have a higher excited state energy level than that of the dopant. In particular, the $T_1$ energy level of the polymer should be sufficiently high for excited state energy to be transferred from the $T_1$ energy level of the host to the $T_1$ level of the emitter. Preferably, the host has a $T_1$ energy level sufficiently high to prevent energy back-transfer from the $T_1$ energy level of the emitter, and in particular a $T_1$ energy level higher than that of the emitter. However, in some cases the $T_1$ energy level of the host may be the same, or even lower, than that of the emitter.

Materials that may be used as fluorescent or phosphorescent dopants include metal complexes comprising optionally substituted complexes of formula (III), provided that LUMO level of the complex relative to that of the electron transporting material has a higher LUMO level than that of the electron trapping electroluminescent material:

$$ML^1{}_q L^2{}_r L^3{}_s \qquad (III)$$

wherein M is a metal; each of $L^1$, $L^2$ and $L^3$ is a coordinating group; q is an integer; r and s are each independently 0 or an integer; and the sum of $(a \cdot q)+(b \cdot r)+(c \cdot s)$ is equal to the number of coordination sites available on M, wherein a is the number of coordination sites on $L^1$, b is the number of coordination sites on $L^2$ and c is the number of coordination sites on $L^3$.

Heavy elements M induce strong spin-orbit coupling to allow rapid intersystem crossing and emission from triplet or higher states (phosphorescence). Suitable heavy metals M include:

lanthanide metals such as cerium, samarium, europium, terbium, dysprosium, thulium, erbium and neodymium; and d-block metals, in particular those in rows 2 and 3 i.e. elements 39 to 48 and 72 to 80, in particular ruthenium, rhodium, pallaidum, rhenium, osmium, iridium, platinum and gold. Iridium is particularly preferred.

Suitable coordinating groups for the f-block metals include oxygen or nitrogen donor systems such as carboxylic acids, 1,3-diketonates, hydroxy carboxylic acids, Schiff bases including acyl phenols and iminoacyl groups. As is known, luminescent lanthanide metal complexes require sensitizing group(s) which have the triplet excited energy level higher than the first excited state of the metal ion. Emission is from an f-f transition of the metal and so the emission color is determined by the choice of the metal. The sharp emission is generally narrow, resulting in a pure color emission useful for display applications.

The d-block metals are particularly suitable for emission from triplet excited states. These metals form organometallic complexes with carbon or nitrogen donors such as porphyrin or bidentate ligands of formula (IV):

wherein $Ar^4$ and $Ar^5$ may be the same or different and are independently selected from optionally substituted aryl or heteroaryl; $X^1$ and $Y^1$ may be the same or different and are independently selected from carbon or nitrogen; and $Ar^4$ and $Ar^5$ may be fused together. Ligands wherein $X^1$ is carbon and $Y^1$ is nitrogen are particularly preferred.

Examples of bidentate ligands are illustrated below:

Each of Ar⁴ and Ar⁵ may carry one or more substituents. Two or more of these substituents may be linked to form a ring, for example an aromatic ring. Particularly preferred substituents include fluorine or trifluoromethyl which may be used to blue-shift the emission of the complex as disclosed in WO 02/45466, WO 02/44189, US 2002-117662 and US 2002-182441; alkyl or alkoxy groups as disclosed in JP 2002-324679; carbazole which may be used to assist hole transport to the complex when used as an emissive material as disclosed in WO 02/81448; bromine, chlorine or iodine which can serve to functionalize the ligand for attachment of further groups as disclosed in WO 02/68435 and EP 1245659; and dendrons which may be used to obtain or enhance solution processability of the metal complex as disclosed in WO 02/66552.

A light-emitting dendrimer typically comprises a light-emitting core bound to one or more dendrons, wherein each dendron comprises a branching point and two or more dendritic branches. Preferably, the dendron is at least partially conjugated, and at least one of the core and dendritic branches comprises an aryl or heteroaryl group.

Other ligands suitable for use with d-block elements include diketonates, in particular acetylacetonate (acac); triarylphosphines and pyridine, each of which may be substituted.

Main group metal complexes show ligand based, or charge transfer emission. For these complexes, the emission color is determined by the choice of ligand as well as the metal.

The host material and metal complex may be combined in the form of a physical blend. Alternatively, the metal complex may be chemically bound to the host material. In the case of a polymeric host, the metal complex may be chemically bound as a substituent attached to the polymer backbone, incorporated as a repeat unit in the polymer backbone or provided as an end-group of the polymer as disclosed in, for example, EP 1245659, WO 02/31896, WO 03/18653 and WO 03/22908.

A wide range of fluorescent low molecular weight metal complexes are known and have been demonstrated in organic light emitting devices [see, e.g., Macromol. Sym. 125 (1997) 1-48, U.S. Pat. Nos. 5,150,006, 6,083,634 and 5,432,014]. Suitable ligands for di or trivalent metals include: oxinoids, e.g. with oxygen-nitrogen or oxygen-oxygen donating atoms, generally a ring nitrogen atom with a substituent oxygen atom, or a substituent nitrogen atom or oxygen atom with a substituent oxygen atom such as 8-hydroxyquinolate and hydroxyquinoxalinol-10-hydroxybenzo (h) quinolinato (II), benzazoles (III), schiff bases, azoindoles, chromone derivatives, 3-hydroxyflavone, and carboxylic acids such as salicylato amino carboxylates and ester carboxylates. Optional substituents include halogen, alkyl, alkoxy, haloalkyl, cyano, amino, amido, sulfonyl, carbonyl, aryl or heteroaryl on the (hetero) aromatic rings which may modify the emission color.

The electron transporting layer preferably has a thickness in the range of up to 100 nm.

The electron transporting material preferably has a LUMO level in the range of 1.8-2.6 eV as measured by cyclic voltammetry as described below.

Hole-transporting Electroluminescent Layer

The hole transporting material of the hole transporting electroluminescent layer preferably comprises a polymer comprising arylamine repeat units as described above. This polymer is preferably a copolymer comprising arylene repeat units, in particular fluorene repeat units as described above. The arylamine units are preferably present in a range from 25-100 mol %.

In one embodiment, the electron trapping electroluminescent material is a fluorescent material. One particular electron trapping electroluminescent material comprises an optionally substituted red-emitting repeat unit of a polymer, said repeat unit having formula (V):

Preferred optional substituents for repeat unit (III) are as defined with respect to R¹. One or more substituents may be provided. A particularly preferred substituent for the repeat unit (V) is alkyl.

In another embodiment, the electron trapping electroluminescent material may comprise a perylene. The perylene may be provided as a repeat unit in the backbone of the polymer, the perylene unit may be directly bound to adjacent repeat units or it may be bound via spacer groups. The perylene may be bound through any position, and substituted at any position. Preferred repeat units according to this embodiment include formulae a and b:

wherein R1', R2' and R5' are optional substituents independently selected from the group consisting of alkyl, optionally substituted aryl, alkoxy, thioether and amine. Preferred substituents are alkyl, more preferably branched alkyl; and phenyl, more preferably alkyl-substituted phenyl. For ease of synthesis, R1' and R2' are preferably the same. $R_5'$ is a spacer group, preferably alkylene, arylene (in particular phenylene), oxygen, nitrogen, sulphur or combinations thereof, in particular arylalkyl. The synthesis of such materials is described in WO2010/013006, see especially example three therein, in which a monomer for forming a main chain perylene repeat unit was prepared according to the scheme below:

i) 3 eq. 1-I-4-Br-C₆H₄, 0.2 eq. Pd(PPh₃)₄, 4 eq. Ag₂CO₃, anhyd. THF, reflux 2 hr. Purified by column chromatography followed by sublimation and repeated recrystallisation In another embodiment, the electron trapping electroluminescent material is a phosphorescent dopant in a host material. The host material may be separate from the hole transporting material, however in one preferred embodiment the hole transporting material also functions as the host. The phosphorescent dopant may be blended with or physically attached to the host material, as described above with respect to the combination of the electron transporting material and a phosphorescent dopant. Endcap on polymer.

Suitable phosphorescent materials include metal complexes of formula (IV) described above, provided that their LUMO level relative to that of the electron transporting material is such as to create an electron trap The hole transporting electroluminescent layer preferably has a thickness in the range of 5-50 nm.

The hole transporting material preferably has a HOMO level in the range of 4.7-5.5 eV when measured by the measurement method described below.

The electron-trapping electroluminescent material preferably has a LUMO level in the range of 2.6-3.6 eV when measured by the measurement method described below.

Polymerization Method

In the case where the device comprises conjugated polymers, said polymers are preferably formed by a metal-catalyzed polymerization reaction which operates via a metal insertion wherein the metal atom of a metal complex catalyst is inserted between an aryl group and a leaving group of a monomer, in particular Suzuki polymerization as described in, for example, WO 00/53656 and Yamamoto polymerization as described in, for example, T. Yamamoto, "Electrically Conducting And Thermally Stable π-Conjugated Poly (arylene)s Prepared by Organometallic Processes", Progress in Polymer Science 1993, 17, 1153-1205.

In the case of Yamamoto polymerization, a nickel complex catalyst is used and the monomer comprises at least two reactive halogen groups. In the case of Suzuki polymerization, a palladium complex catalyst is used in the presence of a base; at least one reactive group is a boron derivative group such as a boronic acid or boronic ester; and the other reactive group is a halogen.

Preferred halogens are chlorine, bromine and iodine, most preferably bromine. Other reactive leaving groups that may be used in place of halogen include esters of sulfonic acids such as mesylate and triflate groups.

The polymers are preferably end-capped. An end-capping reagent may be added at the end of the polymerization. However, in some cases it may be beneficial to add the end-capping reagent during or at the start of polymerization, for example in order to control the polymer's molecular weight.

Charge Injection Layers

It is particularly desirable to provide a conductive hole injection layer, which may be formed from a conductive organic or inorganic material provided between the anode 2 and the electroluminescent layer 3 to assist hole injection from the anode into the layer or layers of semiconducting polymer. Examples of doped organic hole injection materials include doped poly(ethylene dioxythiophene) (PEDT), in particular PEDT doped with a charge-balancing polyacid such as polystyrene sulfonate (PSS) as disclosed in EP 0901176 and EP 0947123, polyacrylic acid or a fluorinated sulfonic acid, for example Nafion®; polyaniline as disclosed in U.S. Pat. Nos. 5,723,873 and 5,798,170; and optionally substituted polythiophene or poly(thienothiophene). Examples of conductive inorganic materials include transition metal oxides such as VOx MoOx and RuOx as disclosed in Journal of Physics D: Applied Physics (1996), 29(11), 2750-2753.

Further layers may be located between anode 2 and cathode 5, such as charge transporting, charge injecting or charge blocking layers. For example, one or more non-emissive electron transporting and/or injecting layers may be provided between the cathode and the first electroluminescent layer.

Device Structure

The electroluminescent layers of the device may be patterned or unpatterned. A device comprising an unpatterned layer may be used an illumination source, for example. A white light emitting device is particularly suitable for this purpose. A device comprising a patterned layer may be, for example, an active matrix display or a passive matrix display. In the case of an active matrix display, a patterned electroluminescent layer is typically used in combination with a patterned anode layer and an unpatterned cathode. In the case of a passive matrix display, the anode layer is formed of parallel stripes of anode material, and parallel stripes of electroluminescent material and cathode material arranged perpendicular to the anode material wherein the stripes of electroluminescent material and cathode material are typically separated by stripes of insulating material ("cathode separators") formed by photolithography.

Cathode

Cathode 4 is selected from materials that have a workfunction allowing injection of electrons into the electroluminescent layer. Other factors influence the selection of the cathode such as the possibility of adverse interactions between the cathode and the electroluminescent material. The cathode may consist of a single material such as a layer of aluminum. Alternatively, it may comprise a plurality of metals, for example a bilayer of a low workfunction material and a high workfunction material such as calcium and aluminum as disclosed in WO 98/10621; elemental barium as disclosed in WO 98/57381, Appl. Phys. Lett. 2002, 81(4), 634 and WO 02/84759; or a thin layer of metal compound, in particular an oxide or fluoride of an alkali or alkali earth metal, to assist electron injection, for example lithium fluoride as disclosed in WO 00/48258; barium fluoride as disclosed in Appl. Phys. Lett. 2001, 79(5), 2001; and barium oxide. In order to provide efficient injection of electrons into the device, the cathode preferably has a workfunction of less than 3.5 eV, more preferably less than 3.2 eV, most preferably less than 3 eV. Work functions of metals can be found in, for example, Michaelson, J. Appl. Phys. 48(11), 4729, 1977.

The cathode may be opaque or transparent. Transparent cathodes are particularly advantageous for active matrix devices because emission through a transparent anode in such devices is at least partially blocked by drive circuitry located underneath the emissive pixels. A transparent cathode will comprises a layer of an electron injecting material that is sufficiently thin to be transparent. Typically, the lateral conductivity of this layer will be low as a result of its thinness. In this case, the layer of electron injecting material is used in combination with a thicker layer of transparent conducting material such as indium tin oxide.

It will be appreciated that a transparent cathode device need not have a transparent anode (unless, of course, a fully transparent device is desired), and so the transparent anode used for bottom-emitting devices may be replaced or supplemented with a layer of reflective material such as a layer of aluminum. Examples of transparent cathode devices are disclosed in, for example, GB 2348316.

Encapsulation

Optical devices tend to be sensitive to moisture and oxygen. Accordingly, the substrate preferably has good barrier properties for prevention of ingress of moisture and oxygen into the device. The substrate is commonly glass, however alternative substrates may be used, in particular where flexibility of the device is desirable. For example, the substrate may comprise a plastic as in U.S. Pat. No. 6,268,695 which discloses a substrate of alternating plastic and barrier layers or a laminate of thin glass and plastic as disclosed in EP 0949850.

The device is preferably encapsulated with an encapsulant (not shown) to prevent ingress of moisture and oxygen. Suitable encapsulants include a sheet of glass, films having suitable barrier properties such as alternating stacks of polymer and dielectric as disclosed in, for example, WO 01/81649 or an airtight container as disclosed in, for example, WO 01/19142. A getter material for absorption of any atmospheric moisture and/or oxygen that may permeate through the substrate or encapsulant may be disposed between the substrate and the encapsulant.

The embodiment of FIG. 4 illustrates a device wherein the device is formed by firstly forming an anode on a substrate followed by deposition of an electroluminescent layer and a cathode, however it will be appreciated that the device of the invention could also be formed by firstly forming a cathode on a substrate followed by deposition of an electroluminescent layer and an anode.

Solution Processing

The electroluminescent layers of the device are preferably formed by solution processing. Suitable solvents for polyarylenes, in particular polyfluorenes, include mono- or poly-alkylbenzenes such as toluene and xylene. Particularly preferred solution deposition techniques including printing and coating techniques, preferably spin-coating and inkjet printing.

Spin-coating is particularly suitable for devices wherein patterning of the electroluminescent material is unnecessary—for example for lighting applications or simple monochrome segmented displays.

Inkjet printing is particularly suitable for high information content displays, in particular full color displays. A device may be inkjet printed by providing a patterned layer over the first electrode and defining wells for printing of one color (in the case of a monochrome device) or multiple colors (in the case of a multicolor, in particular full color device). The patterned layer is typically a layer of photoresist that is patterned to define wells as described in, for example, EP 0880303.

As an alternative to wells, the ink may be printed into channels defined within a patterned layer. In particular, the photoresist may be patterned to form channels which, unlike wells, extend over a plurality of pixels and which may be closed or open at the channel ends.

Other solution deposition techniques include dip-coating, roll printing and screen printing.

In the case where the first electroluminescent layer is deposited onto the second electroluminescent layer from a solvent, it is necessary to ensure that the second electroluminescent layer does not dissolve. This may be done for example by crosslinking of the underlying layer before deposition of the subsequent layer or selection of materials for adjacent layers such that the material from which the underlying layer is formed is not soluble in the solvent used to deposit the overlying layer.

Measurements

The HOMO and LUMO energy levels of a material may be measured by cyclic voltammetry (CV) wherein the working electrode potential is ramped linearly versus time. When cyclic voltammetry reaches a set potential the working electrode's potential ramp is inverted. This inversion can happen multiple times during a single experiment.

The current at the working electrode is plotted versus the applied voltage to give the cyclic voltammogram trace.

Apparatus to measure HOMO or LUMO energy levels by CV may comprise a cell containing a tert-butyl ammonium perchlorate solution in acetonitrile, a glassy carbon working electrode where the sample is coated as a film, a platinum counter electrode (donor or acceptor of electrons) and a reference glass electrode Ag wire/AgNO$_3$ solution. Ferrocene is added in the cell at the end of the experiment for calculation purposes. (Measurement of the difference of potential between Ag/AgNO$_3$/ferrocene and sample/ferrocene).

Method and Settings:

3 mm diameter glassy carbon working electrode

Ag/Ag+ non-aqueous reference electrode

Pt wire auxiliary electrode 0.1M tetrabutylammonium perchlorate in acetonitrile

LUMO=4.8−ferrocene (peak to peak maximum average)+onset

Sample: 1 drop of 10 mg/mL in toluene spun @2500 rpm

LUMO (Reduction) Measurement:

A good reversible reduction event is typically observed for thick films (10 mg/ml polymer solution) measured at 100 mV/s and a switching potential of −3V. The reduction events should be measured and compared over 10 cycles, usually measurements are taken on the $2^{nd}$ cycle. The onset is taken at the intersection of lines of best fit at the steepest part of the reduction event and the baseline.

Comparison of the LUMO levels of an electron transporting material and an electroluminescent material will reveal if the electron transporting material will function as an electron trap.

Alternatively, the electron trapping characteristics of an electroluminescent material (or absence thereof) may be established by measuring the electron current at fixed voltage for an electron-only device with and without a small percentage of said electroluminescent material. An electron-only device may comprise the following structure:

Al (15 nm)/Electroluminescent material (60 nm)/NaF (2 nm)/Al (200 nm)/Ag(100 nm)

Current-voltage-luminance (IVL) characteristics of the electroluminescent material may be measured with and without the drive voltage at 10 mA/cm2 (NaF/Al electrode−ve)

An electron trapping material, would show up as a dramatic drop in conductivity (increase in drive voltage).

By using only a small percentage of the electron trapping material (0.005-20%, preferably 0.01-5%, most preferably 0.05-2%), it may be assumed that the amount of electron-trapping material present is not sufficient to alter the electron injection barrier (ie electrons get injected predominantly into the host)The increase in drive voltage required to run a 60 nm thickness electron-only device at 10 mA/cm$^2$ caused by inclusion of the electron trapping material may typically be 0.5 V or more.

EXAMPLES

Example 1

Onto a layer of glass provided with indium tin oxide (ITO) was deposited a layer of hole injection material available from Plextronics, Inc. as Plexcore®. A 20 nm thick hole transporting electroluminescent layer was formed by depositing from solution a mixture of a polymer comprising a fluorene repeat unit and an arylamine repeat unit, and an electron trapping phosphorescent material. A 70 nm thick electroluminescent electron transporting layer was formed by depositing from solution a white-emitting polymer comprising fluorene repeat units, green and blue fluorescent emitting repeat units and a phosphorescent red emitting end-capping unit as described in GB 0801227.0. A cathode was formed by depositing a layer of sodium fluoride to a thickness of 5 nm and a capping layer of aluminum.

In Example 1, the orange-red emission from the electron trapping electroluminescent material combines with the white emission from the electron transporting layer to provide an improved white color as compared to emission from the electron transporting layer alone.

Comparative Example

A device was prepared as described in Example 1 except that the electron trapping phosphorescent material in the hole transporting layer was moved to the electron transporting layer.

Control Device (No Electron Trapping Electroluminescent Material)

A device was prepared as described in Example 1 except that the electron-trapping phosphorescent material in the hole transporting layer was not included in the hole-transporting layer.

The results for these devices are provided in the table below.

|  | V at 1000 cd/m2 | V relative to control | J (mA/cm2) | J relative to control | External quantum efficiency (%) | EQE relative to control |
|---|---|---|---|---|---|---|
| Example 1 | 4.1 | +0.5 V | 6.6 | +0.7 | 9.2 | −0.5 |
| Comparative Example 1 | 5.2 | +1 V | 10.7 | +2.3 | 4.7 | −2.5 |

It is apparent from the above table that moving the electron-trapping electroluminescent material from the electron transporting layer to the hole transporting layer results in a significant recovery in all aspects of device performance as compared to a control device. The invention therefore enables the use of an electron trapping electroluminescent material with little or none of the loss in device performance that would be occur if such a material is used in a conventional device architecture.

The invention claimed is:

1. An organic electroluminescent device comprising:
   an anode;
   a cathode;
   a first electroluminescent layer between the anode and the cathode comprising an electron transporting material; and
   a second electroluminescent layer between the first electroluminescent layer and the anode, wherein said second electroluminescent layer is adjacent to the first electroluminescent layer and said second electroluminescent layer comprises a hole transporting material and an electroluminescent electron trapping material, wherein the electron trapping electroluminescent material emits phosphorescent light when the device is in use, wherein the device is a white light emitting device.

2. A device according to claim 1 wherein the electron transporting material is electroluminescent.

3. A device according to claim 1 wherein the first electroluminescent layer comprises the electron transporting material and an electroluminescent material.

4. A device according to claim 1 wherein the first electroluminescent layer includes a hole-transporting material.

5. A device according to claim 4 wherein the first electroluminescent layer comprises the electron transporting material and an electroluminescent material and the hole-transporting material in the first electroluminescent layer is electroluminescent.

6. A device according to claim 1 wherein the electron transporting material and one or both of the hole transporting material of the first electroluminescent layer and the electroluminescent material of the first electroluminescent layer are part of the same molecule.

7. A device according to claim 6 wherein the molecule is a polymer.

8. A device according to claim 7 wherein the molecule is a polymer and the electron transporting material comprises a plurality of adjacent arylene repeat units.

9. A device according to claim 4 wherein the hole-transporting material of the first electroluminescent layer is an amine.

10. A device according to claim 1 wherein the first electroluminescent layer emits white light.

11. A device according to 1 wherein the second electroluminescent layer comprises a hole-transporting amine material.

12. A device according to claim 1 wherein the LUMO of the electron trapping electroluminescent material is more than 200 meV below the LUMO of the electron-transporting material.

13. A method of forming a device according to claim 1 comprising the steps of depositing the second electroluminescent layer over the anode; depositing the first electroluminescent layer over the second electroluminescent layer; and depositing a cathode over the second electroluminescent layer.

14. A method according to claim 13 comprising depositing at least one of the first and second electroluminescent layers from a solution in a solvent.

15. A method according to claim 14 wherein the second electroluminescent layer is cross-linked prior to depositing the second electroluminescent layer.

16. A device according to claim 1 wherein the device emits light falling within a region having a CIE x coordinate equivalent to that emitted by a black body at 1000-13,000K and CIE y coordinate within 0.05 of the CIE y co-ordinate of said light emitted by a black body.

17. An organic electroluminescent device comprising:
an anode;
a cathode;
a first electroluminescent layer between the anode and the cathode comprising an electron transporting material; and
a second electroluminescent layer between the first electroluminescent layer and the anode, wherein said second electroluminescent layer is adjacent to the first electroluminescent layer and said second electroluminescent layer comprises a hole transporting material and an electroluminescent electron trapping material, wherein the electron trapping electroluminescent material emits phosphorescent light when the device is in use, wherein the first electroluminescent layer includes a hole-transporting material.

* * * * *